United States Patent
Gutman et al.

(10) Patent No.: US 11,245,428 B2
(45) Date of Patent: Feb. 8, 2022

(54) DIGITAL PREDISTORTION TRAINING PROCEDURE FOR MASSIVE ARRAY

(71) Applicant: QUALCOMM Incorporated, San Diego, CA (US)

(72) Inventors: Igor Gutman, Ramat Gan (IL); Michael Levitsky, Rehovot (IL); Assaf Touboul, Netanya (IL); Ronen Shaked, Kfar Saba (IL)

(73) Assignee: QUALCOMM Incorporated, San Diego, CA (US)

( * ) Notice: Subject to any disclaimer, the term of this patent is extended or adjusted under 35 U.S.C. 154(b) by 35 days.

(21) Appl. No.: 16/817,338

(22) Filed: Mar. 12, 2020

(65) Prior Publication Data

US 2021/0288681 A1 Sep. 16, 2021

(51) Int. Cl.
| | |
|---|---|
| *H04B 1/04* | (2006.01) |
| *G06F 16/22* | (2019.01) |
| *H04L 5/00* | (2006.01) |
| *H04W 72/04* | (2009.01) |
| *H04W 72/08* | (2009.01) |
| *H04W 88/08* | (2009.01) |

(52) U.S. Cl.
CPC .......... *H04B 1/0475* (2013.01); *G06F 16/22* (2019.01); *H04L 5/0048* (2013.01); *H04W 72/0453* (2013.01); *H04W 72/08* (2013.01); *H04B 2001/0408* (2013.01); *H04W 88/08* (2013.01)

(58) Field of Classification Search
CPC .......... H04B 1/0475; H04B 2001/0408; G06F 16/22; H04L 5/0048; H04L 5/0051; H04L 1/248; H04W 72/0453; H04W 72/08; H04W 88/08; H03F 3/68; H03F 2200/451; H03F 3/189; H03F 1/3247; H03F 3/24
See application file for complete search history.

(56) References Cited

U.S. PATENT DOCUMENTS

| | | | |
|---|---|---|---|
| 8,718,178 B1 * | 5/2014 | Carbone | H04B 1/525 375/285 |
| 2004/0189378 A1 * | 9/2004 | Suzuki | H03F 1/0288 330/52 |

(Continued)

OTHER PUBLICATIONS

International Search Report and Written Opinion—PCT/US2021/021978—ISA/EPO—dated Jul. 7, 2021.

*Primary Examiner* — Vineeta S Panwalkar
(74) *Attorney, Agent, or Firm* — Procopio, Cory, Hargreaves LLP; Timothy R. Hirzel

(57) ABSTRACT

This disclosure provides systems, devices, apparatus and methods, including computer programs encoded on storage media, for a DPD training procedure. A base station may transmit, for a plurality of iterations, a signal to at least one UE through a plurality of transmit chains and with application of DPD. The signal transmitted for each iteration may be transmitted with a BW that extends over a plurality of subcarriers and includes pilots extending over a BW subset that increases in subcarrier size for each iteration. The base station may receive, for each iteration, feedback from the at least one UE based on the transmitted signal and apply DPD to each of the plurality of transmit chains based on the feedback. Accordingly, the base station may transmit to one or more UEs through the plurality of transmit chains and with application of the DPD pilot signals that extend over the entire BW.

30 Claims, 11 Drawing Sheets

(56) References Cited

U.S. PATENT DOCUMENTS

| | | | |
|---|---|---|---|
| 2012/0281777 A1* | 11/2012 | Ho | H04B 1/0475 |
| | | | 375/267 |
| 2015/0304068 A1* | 10/2015 | Xiong | H03F 1/3241 |
| | | | 375/267 |
| 2019/0068429 A1 | 2/2019 | Sagi et al. | |
| 2019/0089389 A1 | 3/2019 | Gutman et al. | |
| 2019/0190552 A1 | 6/2019 | Sagi et al. | |

\* cited by examiner

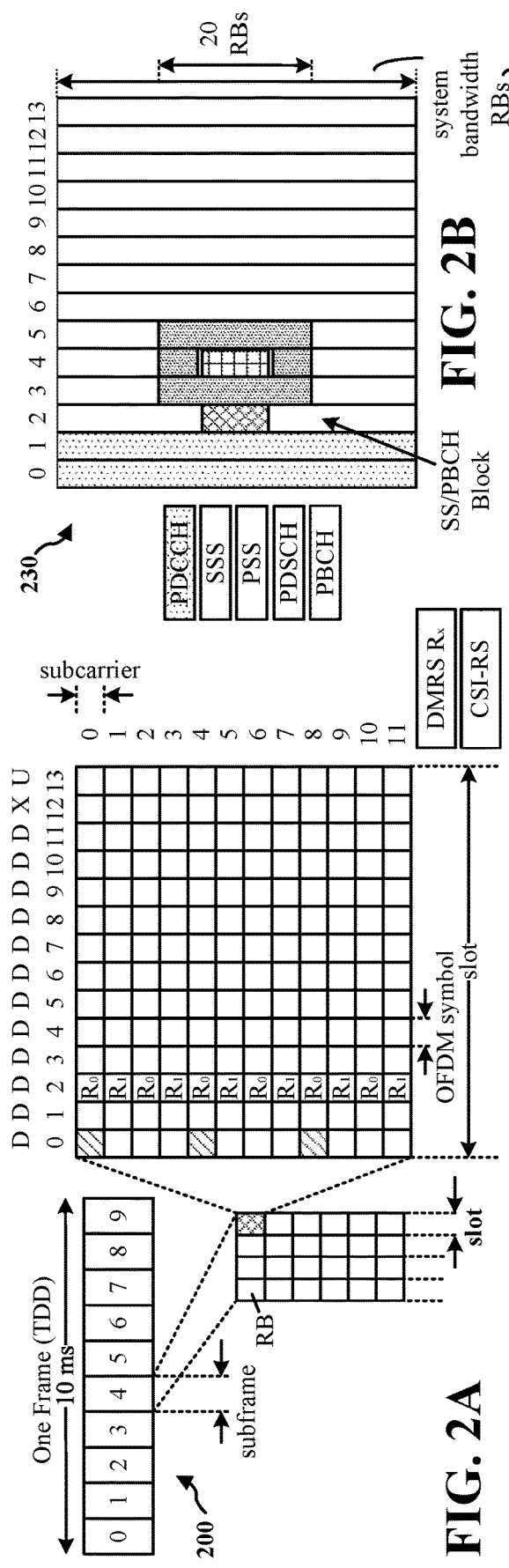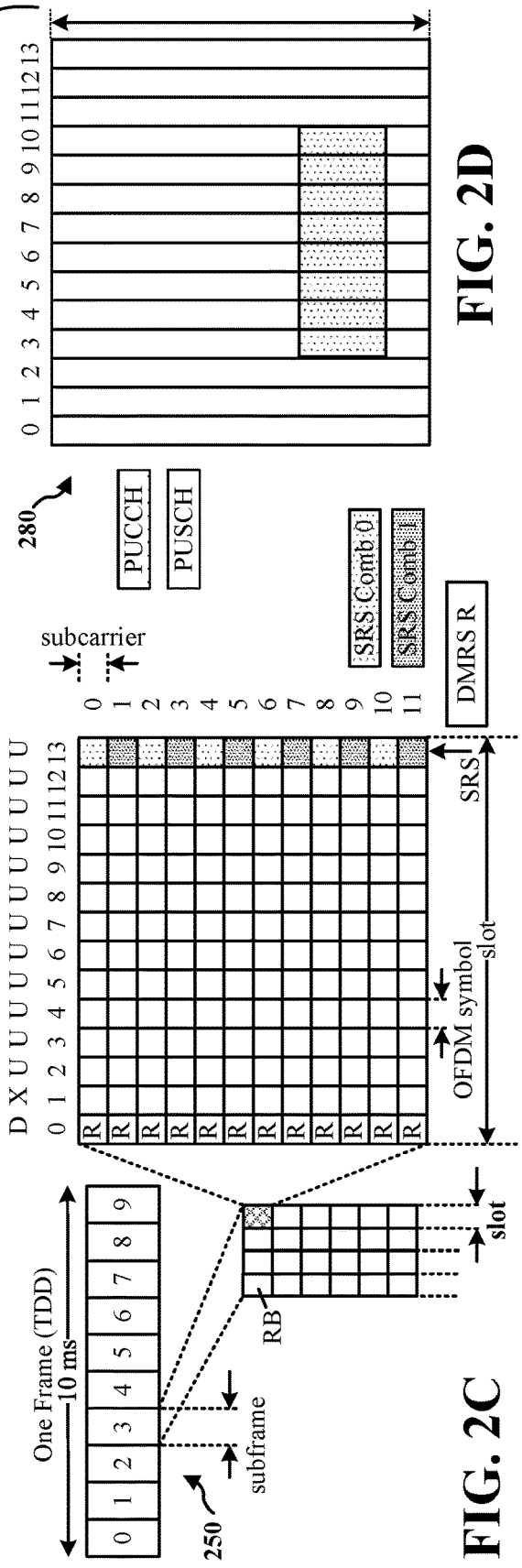

DIGITAL PREDISTORTION TRAINING PROCEDURE FOR MASSIVE ARRAY

BACKGROUND

Technical Field

The present disclosure relates generally to communication systems, and more particularly, to a digital predistortion (DPD) training procedure for a massive array.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Transmitters used for transmitting wireless signals may include a component, such as a power amplifier (PA), that introduces a non-linearity in the transmitted signal. As such distortion in the transmitted signal may impact a transmission range thereof, digital predistortion (DPD) may be performed to linearize/cancel the non-linearity. One type of non-linear distortion is out-of-band (OOB) distortion, for which regulatory bodies generally require emissions to be below a predetermined threshold. While techniques such as power back-off (BO) may be utilized to decrease OOB emissions below the threshold, a significant reduction in an overall power of the transmitted signal may occur as a result of applying too much BO. Hence, a DPD training procedure may be desired for transmitting signals at a higher power, while still using up to a maximum allowable bandwidth (BW), and without violating an OOB emissions protocol.

Accordingly, a DPD training procedure may be performed based on an iterative process where DPD is repeatedly applied to BW subsets that increase in size with each iteration until the DPD is trained for use with the maximum allowable transmission BW. To perform the training procedure, the transmitter may apply a bypass on the DPD to transmit a pilot with a first bandwidth subset (e.g., BW/8) that acknowledges a receiver regarding a first iteration of the DPD training procedure. The receiver may determine coefficients associated with distortion caused by the PAs and feedback the coefficients to the transmitter to train the transmitter on the DPD for use with transmission of a second pilot with a second bandwidth subset (e.g., BW/4). The second pilot may similarly acknowledge the receiver regarding a second iteration, determines second coefficients based on second distortion caused by the PAs, and feedback the second coefficients to the transmitter to further train the transmitter on the DPD for use with transmission of a third pilot with a third bandwidth subset (e.g., BW/2). The same process may be repeated (e.g., for BW/2) until the transmitter is at last trained on the DPD for use with transmission of signals that extend over the full BW. In this manner, signals may be transmitted over the maximum allowable BW without having to increase the power BO.

In an aspect of the disclosure, a method, a computer-readable medium, and an apparatus are provided. The apparatus may include a memory and at least one processor coupled to the memory and configured to transmit, for each iteration i=1, ..., m of a plurality of iterations m, through a plurality of transmit (Tx) chains and with application of a digital predistortion ($DPD_i$) a signal $S_i$ to at least one UE, where $DPD_1$ is an initial DPD and each of the signals $S_i$ for i=1, ..., m is transmitted over a bandwidth (BW) that extends over a plurality of subcarriers, and includes pilot signals extending over a bandwidth subset $BW_i$ of the BW, where the $BW_i$ increases in subcarrier size for each iteration of i. The at least one processor may receive, for each iteration i of the plurality of iterations m, feedback $F_i$ from the at least one UE based on the transmitted signal $S_i$, and apply, for each iteration i of the plurality of iterations m, a digital predistortion ($DPD_{i+1}$) to each of the plurality of Tx chains based on the received feedback $F_i$. Further, the at least one processor may transmit in downlink (DL) to one or more UEs through the plurality of Tx chains and with application of the $DPD_{m+1}$, the transmission in DL including pilot signals that extend over the entire BW.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 2A, 2B, 2C, and 2D are diagrams illustrating examples of a first 5G/NR frame, DL channels within a 5G/NR subframe, a second 5G/NR frame, and UL channels within a 5G/NR subframe, respectively.

DETAILED DESCRIPTION

Figure 1:
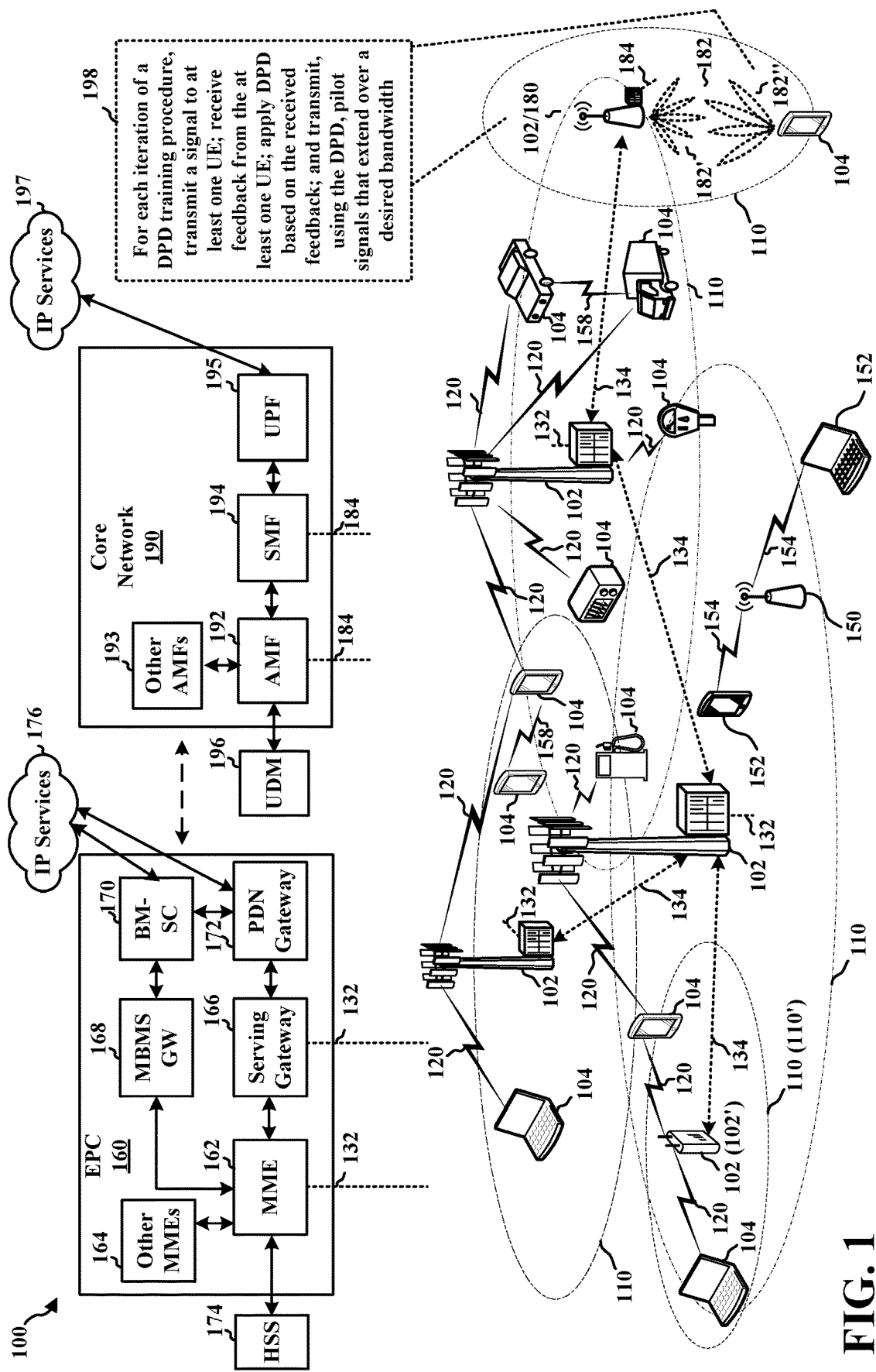
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band (e.g., 3 GHz-300 GHz) has extremely high path loss and a short range. The mmW base station 180 may utilize beamforming 182 with the UE 104 to compensate for the extremely high path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the base station 180 may be configured, for each iteration of a DPD training procedure, to transmit a signal to at least one UE; receive feedback from the at least one UE; apply DPD based on the received feedback; and transmit, using the DPD, pilot signals that extend over a desired bandwidth (198). Although the following description may be focused on 5G NR, the concepts described herein may be applicable to other similar areas, such as LTE, LTE-A, CDMA, GSM, and other wireless technologies.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies μ 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and $2^\mu$ slots/subframe. The subcarrier spacing and symbol length/duration are a function of the numerology. The subcarrier spacing may be equal to $2^\mu*15$ kHz, where μ is the numerology 0 to 5. As such, the numerology μ=0 has a subcarrier spacing of 15 kHz and the numerology μ=5 has a subcarrier spacing of 480 kHz. The symbol length/duration is inversely related to the subcarrier spacing. FIGS. 2A-2D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
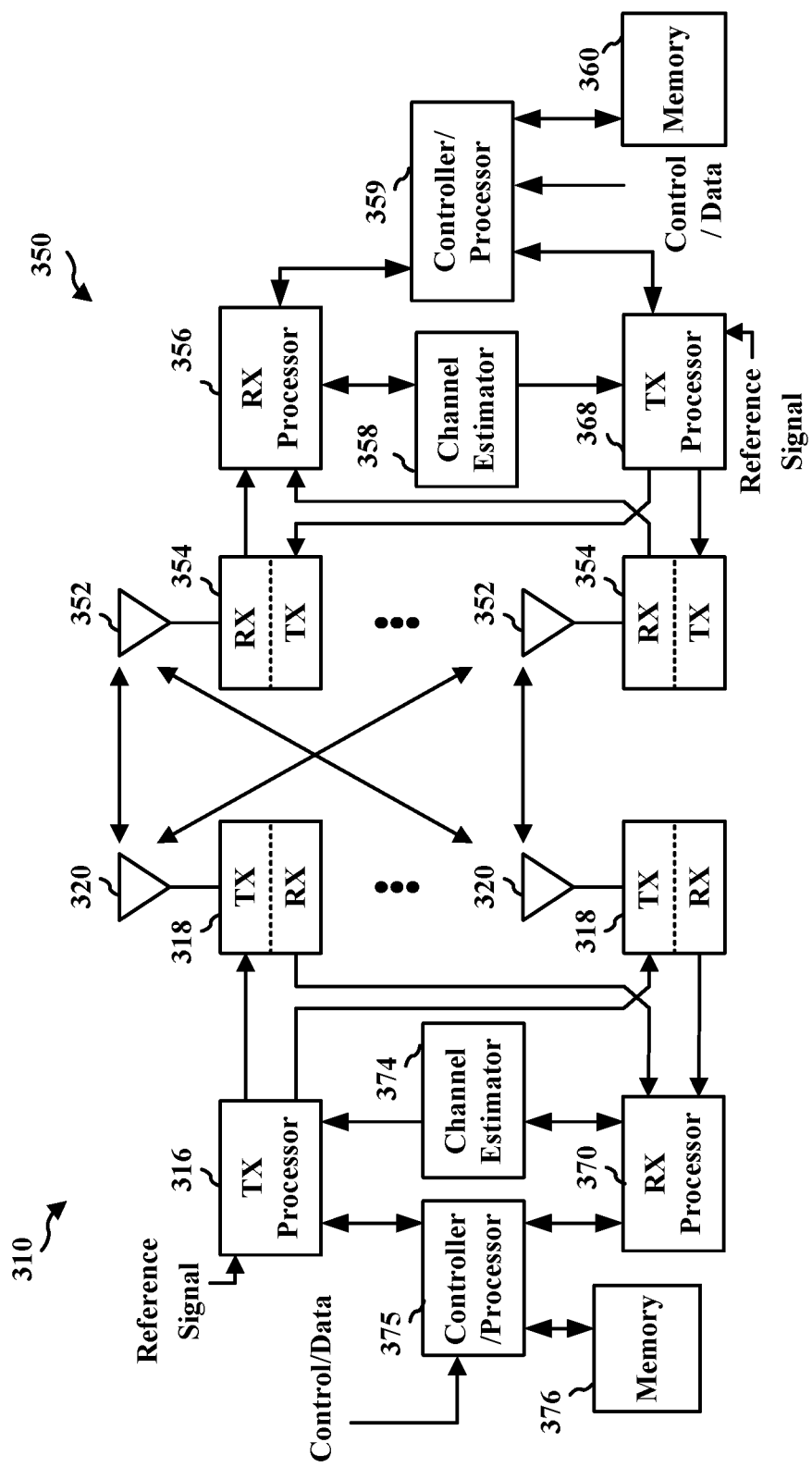
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 316, the RX processor 370, and the controller/processor 375 may be configured to perform aspects in connection with 198 of FIG. 1.

Wireless communication systems may be configured to share available system resources and provide various telecommunication services (e.g., telephony, video, data, messaging, broadcasts, etc.) based on multiple-access technologies such as CDMA systems, TDMA systems, FDMA systems, OFDMA systems, SC-FDMA systems, TD-SCDMA systems, etc. that support communication with multiple users. In many cases, common protocols that facilitate communications with wireless devices are adopted in various telecommunication standards. For example, communication methods associated with eMBB, mMTC, and URLLC may be incorporated in the 5G NR telecommunication standard, while other aspects may be incorporated in the 4G LTE standard. As mobile broadband technologies are part of a continuous evolution, further improvements in mobile broadband remain useful to continue the progression of such technologies.

Figure 4:
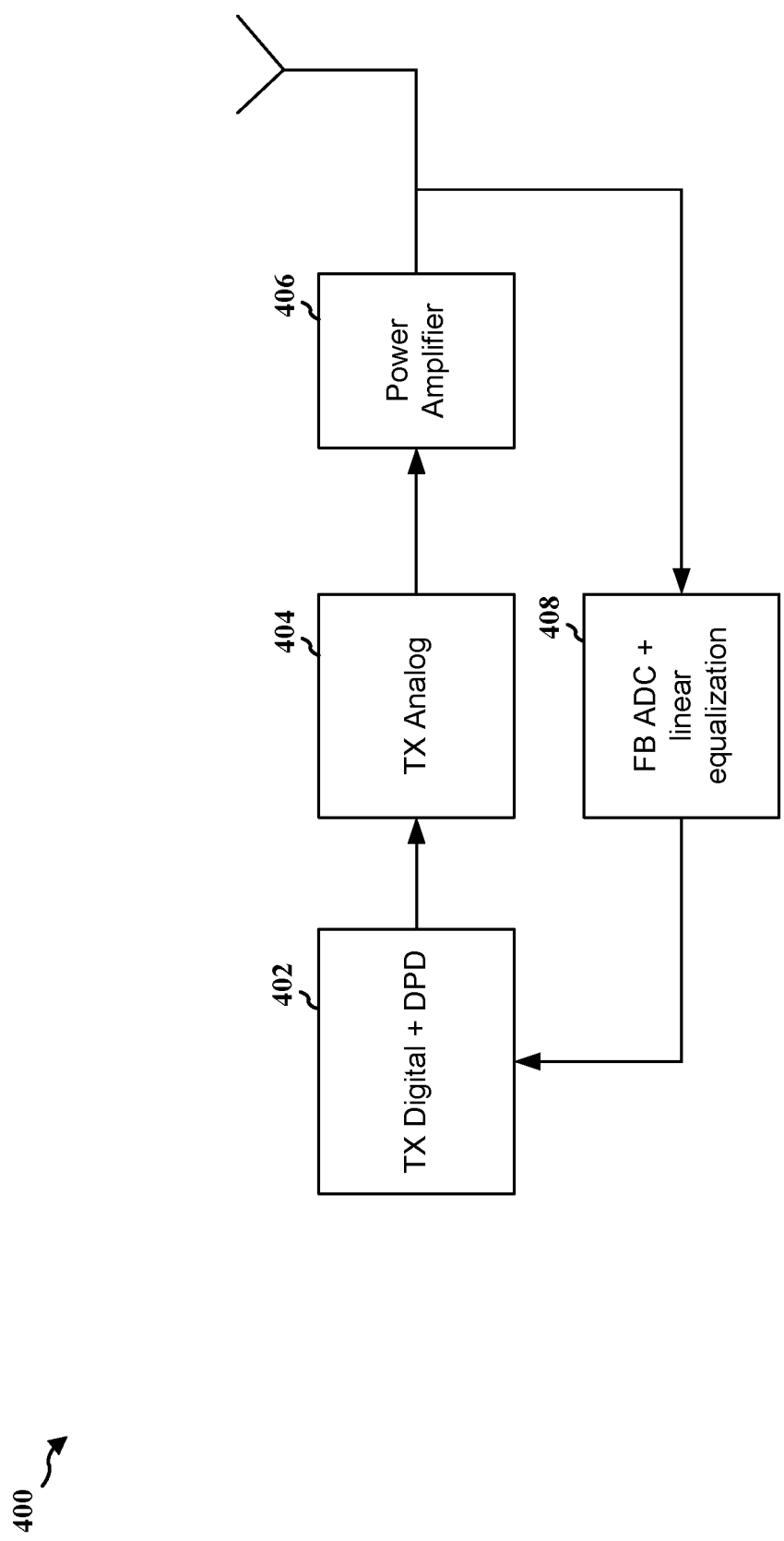
FIG. 4 illustrates a feedback loop for applying DPD to a transmit element.
Figure 5:
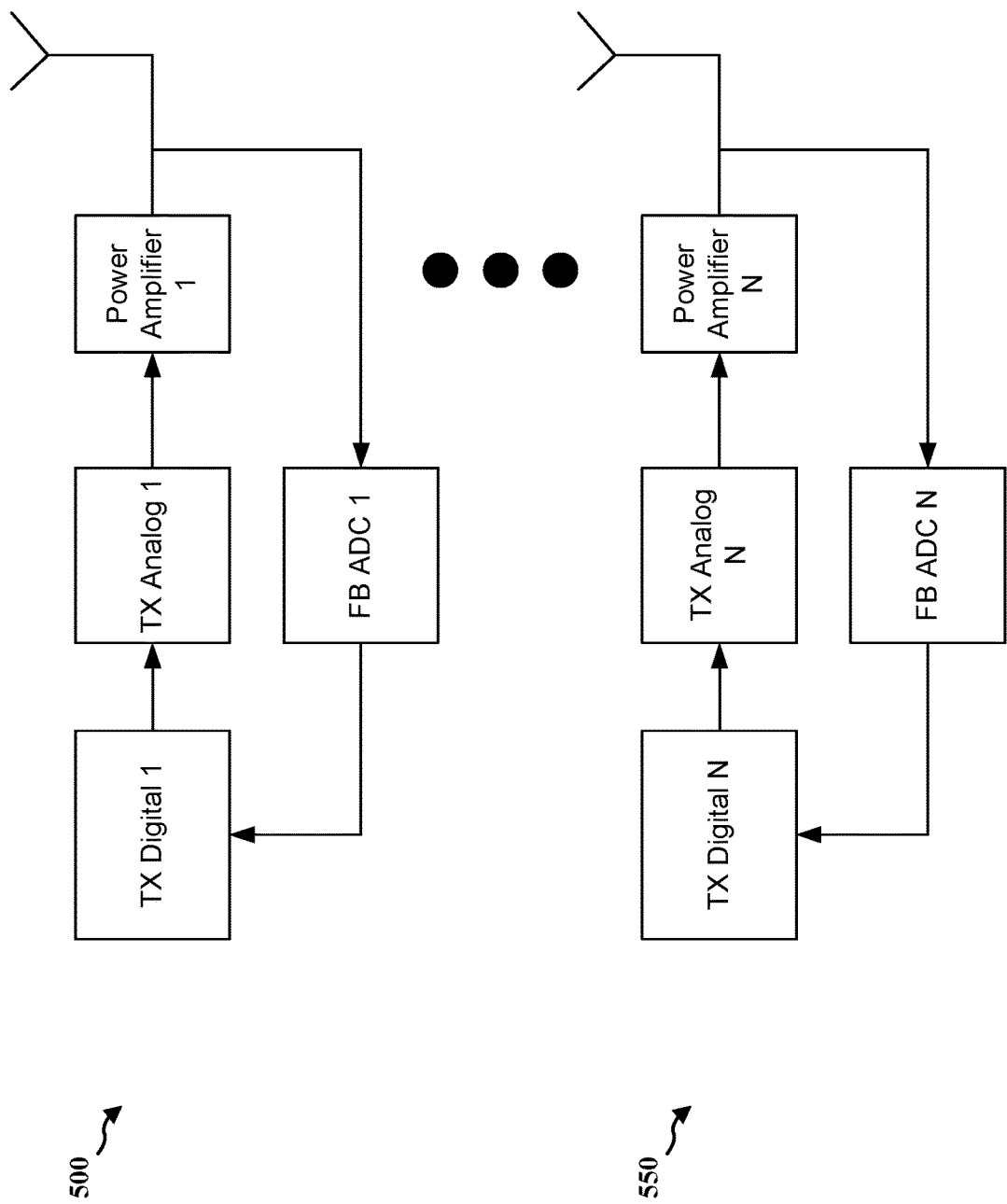
FIG. 5 illustrates a plurality of feedback loops for applying DPD to a plurality of transmit elements.
Figure 6:
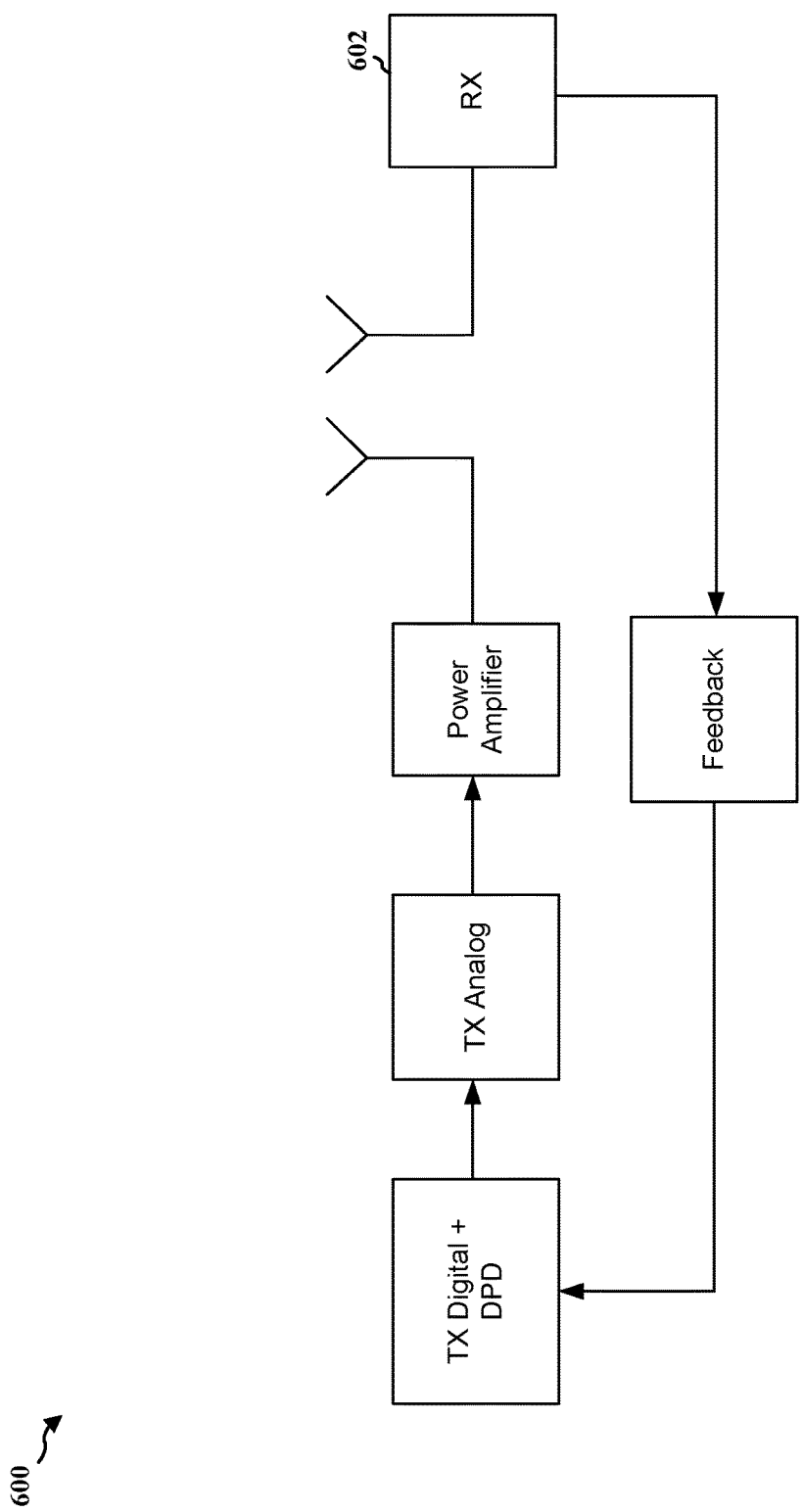
FIG. 6 illustrates a feedback loop from a receiver for applying DPD to a transmit element.

FIGS. 4-6 illustrate feedback loops that may be used for applying DPD to a transmitted signal. Efficient utilization of resources is generally desired in wireless system designs. However, in instances of a transmitter configured to transmit radiated power, the transmitter may include non-linear components, such as a power amplifier, that may distort the transmitted signal based on a high peak-to-average power ratio (PAPR). Such distortion may impact a transmission range of the transmitted signal. As such, a digital processor may be configured to perform DPD on the signal to be transmitted to linearize a non-linearity of the transmitted signal caused by the power amplifier.

Non-linear distortions may include both in-band distortion and out-of-band (OOB) distortion. In-band distortion may impact a link performance for mutual exchanges of information and/or an associated error vector magnitude (EVM). OOB distortion may cause adjacent channel interference (ACI), which may correspond to interference that the transmitted signal has on signals in an adjacent channel.

Depending on the application, deficiencies caused by in-band distortion may need to be cured. In other instances, deficiencies caused by OOB distortion may need to be cured, and in still further instances deficiencies caused by both in-band and OOB distortions may need to be cured. Thus, predistortion may be performed on the transmitted signal to cancel distortion that may be otherwise caused by the power amplifier.

In aspects, power back-off (BO) may also be utilized to decrease an extent of the distortion caused by the power amplifier, as the extent of the distortion may be a function of the power supplied to the power amplifier. BO refers to decreasing the power at the power amplifier to a value that is lower than the maximum power that the power amplifier is configured to operate at when generating an output. Power BO may be used with or without DPD to decrease distortion of the transmitted signal. However, an increase in power BO may result in less power efficiency in the PA, as a signal transmitted through a channel with more BO may be weaker than a signal transmitted through the channel with less BO. Thus, either more costly power amplifiers may need to be used in conjunction with a higher power BO or more power may need to be consumed by the base station for communicating with UEs.

Referring now to FIG. 4, application of DPD to a transmitted signal based on a determined non-linearity model of the power amplifier may result in increased performance/efficiency of the PA. For a base station with a low number of transmit elements, each element may have its own radio frequency (RF) feedback loop from the power amplifier. Such feedback may be used to determine the non-linearity model of the power amplifier based on analog and digital hardware included in the feedback loop.

Diagram 400 illustrates, at 402, that DPD may be applied to a digital part of a signal to be transmitted. After the DPD has been applied to the digital part of the signal, the signal may be converted to an analog signal at 404. The analog signal from 404 may be provided to a power amplifier 406 that outputs the analog signal as the transmitted signal. Feedback from the transmitted signal may be received by an analog-to-digital converter 408 configured to perform linear equalization on the feedback. Non-linear characteristics that result from operations of the power amplifier may be identified based on the feedback from the transmitted signal for applying, at 402, the DPD to the digital part of the signal. Adjustments and application of the DPD to the digital signal at 402 may decrease distortion, thereby allowing the BO to be maintained at a low value (e.g., a high overall power may be supplied to the power amplifier). While distortion may not be completely eliminated based on application of the DPD, an efficiency of the power amplifier may be increased by using the DPD to maintain a smaller BO.

Referring now to FIG. 5, a number of transmit elements/antennas may include a first transmit element 500 through an Nth transmit element 550. While DPD may be applied individually to each of the transmit elements to cancel distortion caused by each of the respective power amplifiers (e.g., power amplifier 1 through power amplifier N), the signals transmitted through the channel are received together at a receiver as a combination of signals. Thus, applying DPD on a per element basis may not be an optimal approach because the receiver receives the transmitted signals as a signal combination having a combined distortion/non-linearity that may not be as effectively cancelled based on individually determined adjustments to each of the individual transmit elements.

While performing DPD on a per element basis may not be the optimal approach in some cases, when performed with a small number of transmit elements, such as 2-4 antennas, the per element approach may still be effective for decreasing distortion in the combined signal. However, in mmW applications, where 20-30 transmit elements may be utilized, the per element approach to applying DPD is less effective for decreasing distortion in the combined signal. Further, training the DPD based on feedback from 20-30 transmit elements may not be practical from both a cost perspective and/or a computation perspective, as transmitted signals in mmW applications may occupy an increased BW that may increase a complexity of such implementations.

Referring now to FIG. 6, diagram 600 illustrates a feedback loop from a receiver 602 (e.g., a receiver of a UE) that provides feedback to transmit elements based on an overall distortion as identified in a combined signal received at the receiver 602 from a plurality of transmit elements. The overall distortion identified in the combined signal may provide a common basis for adjusting each of the transmit elements in a common manner (e.g., rather than based on individualized adjustments). In other words, DPD may be performed on the data level based on the combined signal received at the receiver 602, rather than individually on the antenna level for each of the signals transmitted from each of the plurality of transmit elements.

In order to identify non-linear characteristics of the combined signal caused by the cumulative effect of a plurality of power amplifiers, the signals transmitted from the plurality of transmit elements may need to be transmitted with a low BO. As low BO may correspond to high power at the power amplifiers, in-band and/or OOB distortion(s) may result from the transmission. Thus, the base station may need to transmit a compressed pilot signal in order to receive the feedback associated with the power amplifiers. In some cases, compression performed by the power amplifier may generate OOB emissions that are prohibited by regulatory bodies, such as the Federal Communications Commission (FCC), Institute of Electrical and Electronics Engineers (IEEE), 3GPP, etc., and therefore compression of the pilot signal may not be practical.

Figure 7:
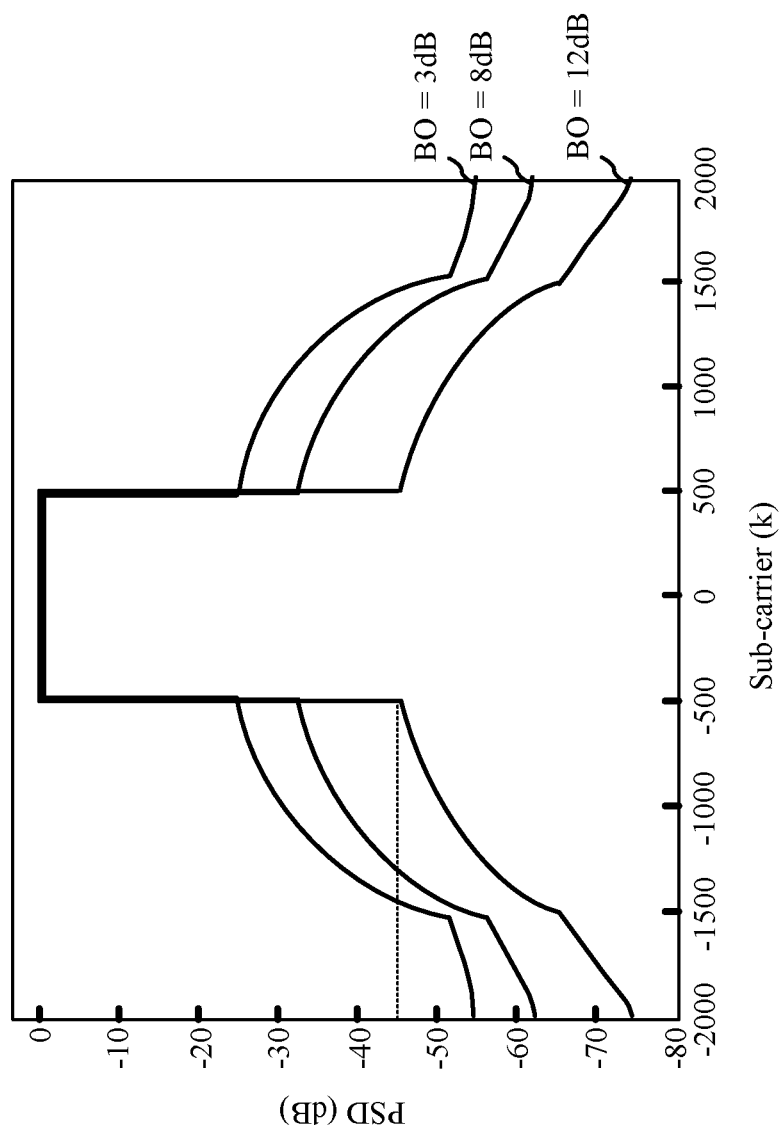
FIG. 7 illustrates out-of-band (OOB) emissions for different power back-off (BO) levels.

FIG. 7 is a graph 700 that illustrates OOB distortions for different BOs. For example, a desired range of a subcarrier index (k) for a signal may be from −512k to 512k. Portions of the signals that reside outside the desired range correspond to OOB distortions. Regulatory bodies may require the base station to maintain an OOB spectral mask of −45 dB, although the threshold may vary depending on applicable protocols. In aspects, a BO may be utilized to decrease OOB emissions below the required threshold (e.g., below −45 dB), since minor clippings may still provide sizeable OOB emissions. For example, in the graph 700, while BOs of 3 dB and 8 dB may each decrease the OOB emissions, a BO of 12 dB is required in the graph 700 to decrease an entirety of the OOB emissions below the required −45 dB threshold.

In identifying a desired BO level, an objective may be to transmit a signal with as much power as possible without violating the OOB emission requirements. The OOB distortion may be caused by compression at the power amplifier. When more compression occurs at the power amplifier, more power is being emitted (e.g., with a smaller BO). Further, transmitting signals with more power generally causes an increase in the OOB emissions. While some compression may occur with a BO of 12 dB in graph 700, the emitted power corresponding to a BO of 12 dB may be smaller than desired/undesired. As such, graph 700 illustrates a tradeoff between the emitted power and decreasing the OOB emissions. For example, transmitting a signal with a BO of 12 dB, when a BO of 3 dB may be preferred, provides a 9 dB power reduction that may cause a cell radius of a base station to be reduced by a factor of 3. In practice, such a reduction in the cell radius could require deployment of up to 10 times as many base stations to maintain a same coverage area.

As DPD training procedures may not be sensitive to small fluctuations in the transmit power, the DPD may be trained for x dBm but with coefficients ranging from x−2 to x+2 without an appreciable impact on performance of the DPD. Further, DPD coefficients tend to be stable in that such coefficients do not change much over time for estimating a transmit power, temperature, and/or BW. DPD may be likewise non-sensitive to small fluctuations in the BW. For example, the DPD may be trained for a BW of 50 Mhz but applied for a range of 0-100 Mhz without an appreciable impact on the performance of the DPD. Such a range may be widened even further when a transmit RF droop is small, as often required by protocol.

Figure 8:
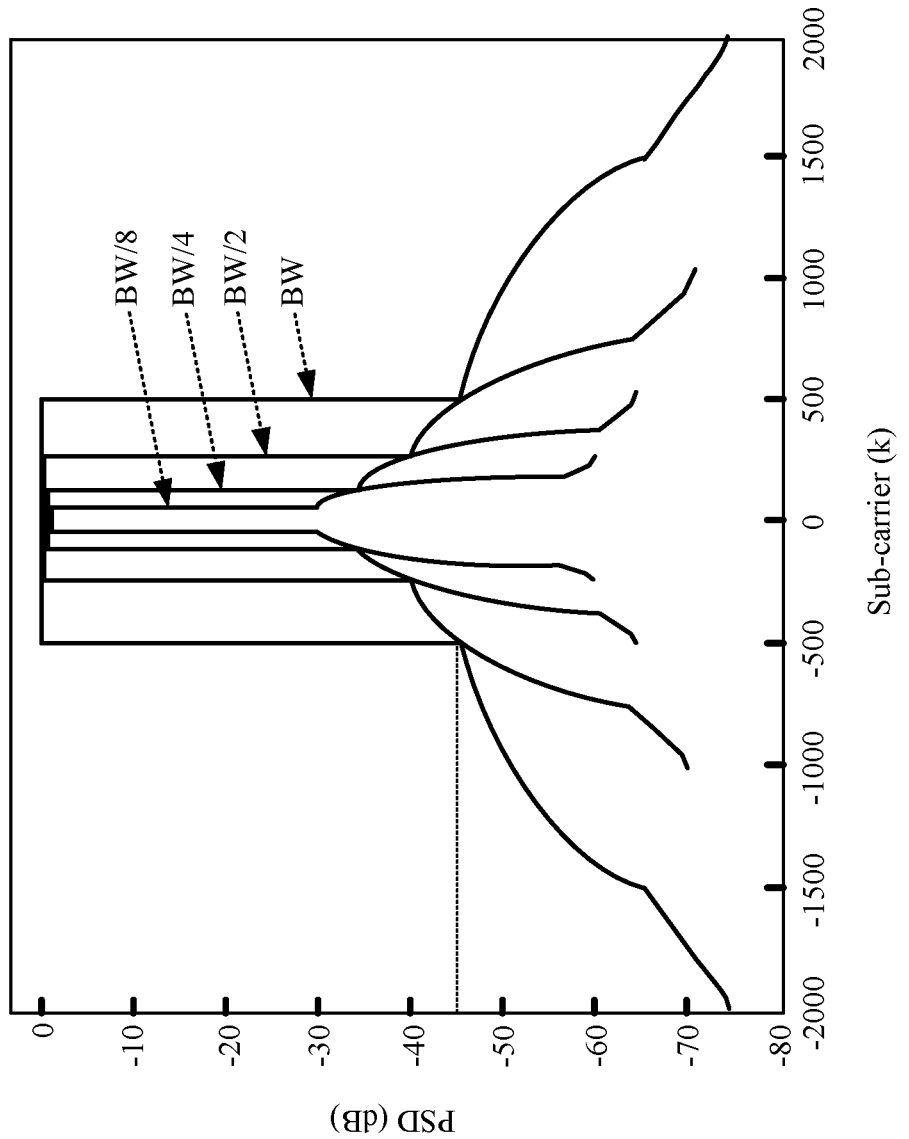
FIG. 8 illustrates a DPD training procedure.

FIG. 8 illustrates a graph 800 for a DPD training procedure. The BW in the graph 800 may be a maximum desired BW for a given BO (e.g., a minimum desired BO). That is, the BO may be a minimum desired BO of 3 dB, for example, while also maintaining the OOB distortion below the −45 dB threshold. In aspects, the DPD training procedure may be based on an iterative process where, for a transmitted signal, coefficients associated with the distortion caused by the power amplifiers are identified at a receiver, fed back to the transmitter, and applied/used for training the DPD in a next transmitted signal/iteration.

In the graph 800, a first signal may be transmitted with a high power but with a low BW (e.g., BW/8). Thus, even though the first signal may be compressed, OOB distortion of the first signal does not violate the OOB emission requirements because the OOB distortion that is above the −45 dB threshold is within an allowable transmission range (e.g., −512k to 512k) where data is normally transmitted. A second signal having BW/4 may be trained based on a non-linearity identified at the receiver for the BW/8 transmission, as a bandwidth factor of 2 may not have an appreciable impact on training the DPD. However, training the DPD for the full BW based on the non-linearity identified at the receiver for the BW/8 transmission may be too large of a difference/factor size for maintaining a threshold level of accuracy in the DPD training procedure. Thus, a third signal having BW/2 may need to be trained based on the non-linearity identified from the BW/4 transmission, and a fourth signal having the full BW may need to be trained based on the non-linearity identified from the BW/2 transmission. For the entire training procedure, the BO may be maintained at a constant BO (e.g., 3 dB) during each iteration.

To perform the training procedure, the transmitter may apply a bypass on the DPD to transmit a pilot with BW/8 that acknowledges the receiver regarding a first iteration. The receiver may determine coefficients based on distortion caused by the associated power amplifiers using a predefined set of kernels and predetermined characteristics of the pilot. Feedback indicative of the coefficients may be returned to the transmitter using a higher layer message. The transmitter may apply the coefficients identified at the receiver in the first iteration for BW/8 to train/transmit a second pilot with BW/4. The transmitted second pilot similarly acknowledges the receiver regarding a second iteration. The receiver may determine a second set of coefficients based on second distortion caused by the associated power amplifiers using the predefined set of kernels and predetermined characteristics of the second pilot to feedback the second set of coefficients to the transmitter using higher layer messaging. The transmitter may likewise apply the second set of coefficients identified at the receiver in the second iteration for BW/4 to train/transmit a third pilot with BW/2 that acknowledges the receiver regarding a third iteration. In the same manner as for the previous iterations, a third set of coefficients may be determined and fed back to the transmitter. Upon conclusion of the third iteration, the transmitter may apply the third set of coefficients to a transmission using the full BW for a PDSCH or other channels, such as a PDCCH.

The first pilot transmitted at BW/8 may be transmitted over 128 subcarriers that may range from −64k to 64k, the second pilot transmitted at BW/4 may be transmitted over 256 subcarriers that may range from −128k to 128k, the third pilot transmitted at BW/2 may be transmitted over 512 subcarriers that may range from −256k to 256k, and the fourth pilot transmitted at BW may be transmitted over 1024 subcarriers that may range from −512k to 512k. In configurations, the factor by which the BW changes from one iteration to the next may be a factor that is different from a factor of 2. For example, in some cases a bandwidth change factor may be a factor of 1.7. Notwithstanding an exact value of the bandwidth change factor, the DPD training procedure should be performed in iterative steps or else a signal transmitted at the full BW may fail the OOB emissions protocol. That is, in graph 800, if the BW/8 transmission is instead transmitted at the full BW, the OOB emissions would be above the required threshold. Based on training the DPD using the iterative approach, OOB distortion for the full BW may be provided below the emissions threshold at a same low BO/high power as that of the BW/8 transmission. In other words, if DPD training is not performed and a next iteration is transmitted at the same BO/power, the OOB distortion for the next iteration would begin at the same dB level as the previous iteration (e.g., the dB level where the OOB distortion begins would not decrease in the next iteration).

Coefficients indicative of non-linearites associated with the power amplifiers may change very slowly. As such, the coefficients may be used to provide close approximations for training the DPD with respect to the non-linearites. In some configurations, the DPD training procedure may be performed over several hours or even days without an appreciable impact on performance of the DPD training procedure. Thus, an overhead on the network for performing the DPD training procedure may be negligible, as the training procedure may be performed in a 200-300 ms training window just once per day, for example.

Since the non-linear distortion is generated on the transmit side of the DPD training procedure, a "crowded" non-linear feedback technique may be utilized to spread the iterations of the DPD training procedure across multiple UEs. The crowded non-linear feedback technique may be managed by the base station. For example, the base station may be in communication with a plurality of UEs, where different UEs may be utilized for different iterations of the training procedure. That is, a first UE may be utilized for a first iteration, a second UE may be utilized for a second iteration, the first/second UEs may be utilized again (or a third UE may be utilized) for the third iteration, etc., such that the DPD training procedure is performed across any number of the same or different UEs in communication with the base station. The DPD training procedure may be implemented for different desired transmit powers and/or temperatures. While the DPD training procedure may be more desirably used in connection with an array of transmit elements, the DPD training procedure may also be implemented for an individual transmit element of the array.

Figure 9:
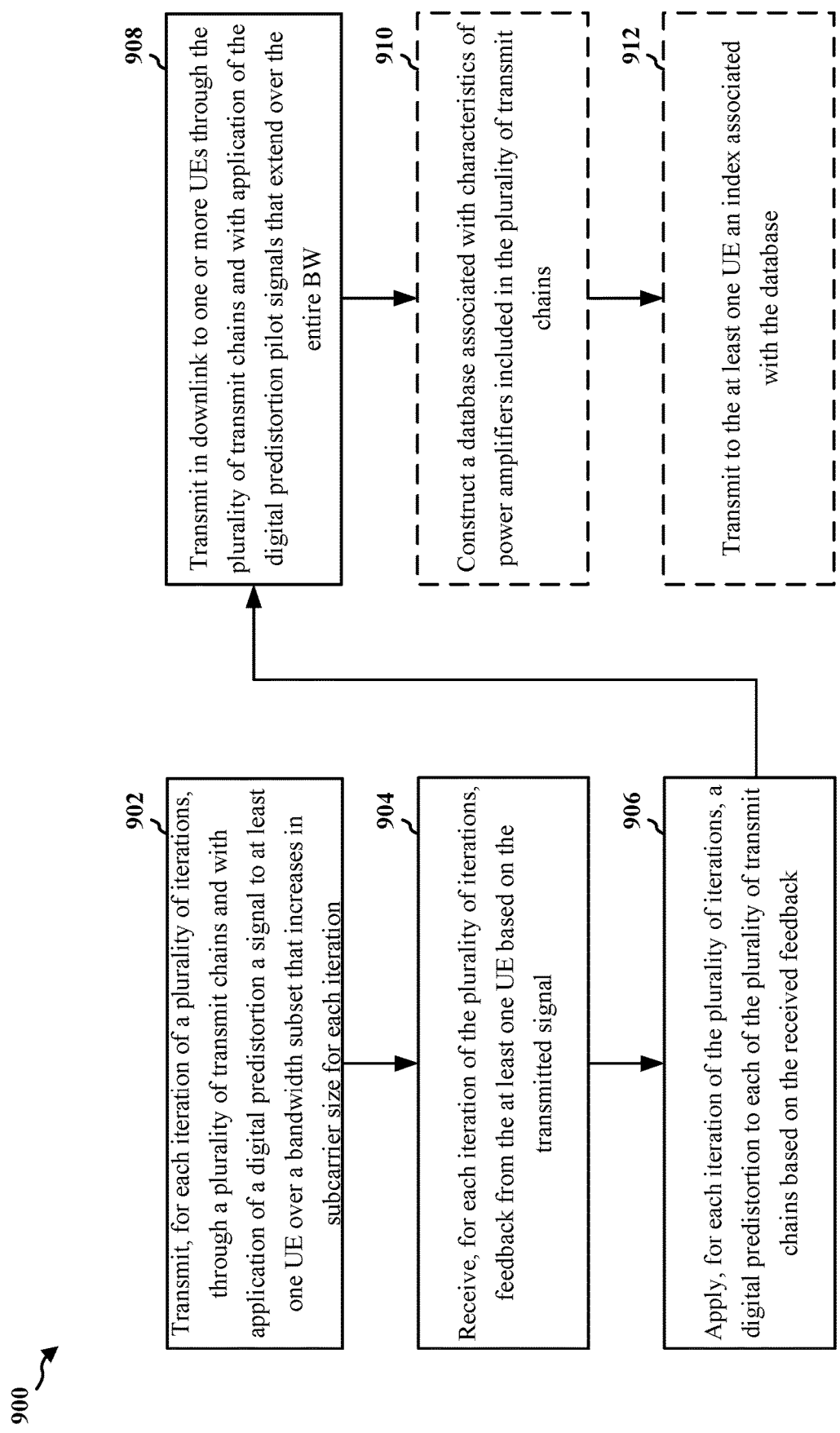
FIG. 9 is a flowchart of a method of operation of a base station.

FIG. 9 is a flowchart 900 of a method of operation of a base station (BS). For example, the method may be performed by the base station(s) (102, 310); the apparatus 1002/1002'; and/or the processing system 1114, which may include the memory 376 and which may be the entire base station 310 or a component of the base station 310, such as the TX processor 316, the RX processor 370, and/or the controller/processor 375.

At 902, the base station may transmit, for each iteration i=1, . . . , m of a plurality of iterations m, through a plurality of transmit (Tx) chains and with application of a digital predistortion (DPDi) a signal $S_i$ to at least one UE, where $DPD_1$ is an initial DPD and each of the signals $S_i$ for i=1, . . . , m is transmitted over a bandwidth (BW) that extends over a plurality of subcarriers, and includes pilot signals extending over a bandwidth subset BWi of the BW, where the BWi increases in subcarrier size for each iteration of i. For example, referring to FIGS. 1, 6, and 8, the base station 102 may transmit, for each iteration in the graph 800, a signal to at least one UE 104 through one or more transmit chains and with application of DPD, as illustrated for example via the transmit chain and application of the DPD in the diagram 600. In the graph 800, each of the signals corresponding to the iterations may include pilots that extend over a subset of the full BW, where each bandwidth subset increases in subcarrier size for each iteration. Further, in the graph 800, DPD may be applied for each iteration of the transmitted signal.

The BW may be centered on a carrier frequency, and pilot signals for the signal $S_i$ may be within the BWi centered on the carrier frequency and excluded from subcarriers outside the BWi that are within the BW. For example, referring to FIG. 8, BW, BW/2, BW/4, and BW/8 may each be centered on carrier frequency 0, such that pilots for each of the respective signals are within the corresponding bandwidth/ bandwidth subsets (e.g., BW, BW/2, BW/4, and BW/8) and excluded from subcarriers outside the corresponding bandwidth/bandwidth subsets. In some configurations, BWi may equal $BW/F_c^{m+1-i}$, where $F_c$ is a bandwidth change factor. For example, referring to FIG. 8, the bandwidth subset may correspond to a size of the BW changed by a factor of 2 with each iteration.

The at least one UE for iteration i may comprise a subset $A_i$ of a set of UEs, where at least two of the UE subsets $A_1, \ldots, A_m$ are different. For example, referring to FIGS. 1 and 8, three iterations may be spread across a subset of UEs included in the plurality of UEs 104, such as a first UE used for iterations 1 and 3 and a second UE used for iteration 2. In other aspects, each of the UE subsets $A_1, \ldots, A_m$ may be different from each other. For example, referring to FIGS. 1 and 8, the three iterations may be spread across three different UEs in the plurality of UEs 104.

At 904, the base station may receive, for each iteration i of the plurality of iterations m, feedback $F_i$ from the at least one UE based on the transmitted signal $S_i$. For example, referring to FIGS. 1, 6, and 8, the base station 102 may receive feedback, as illustrated for example in the diagram 600, for each of the iterations in the graph 800, from at least one UE based on the transmitted signal.

At 906, the base station may apply, for each iteration i of the plurality of iterations m, a digital predistortion ($DPD_{i+1}$) to each of the plurality of Tx chains based on the received feedback $F_i$. For example, referring to FIGS. 1, 6, and 8, the base station 102 may apply, for each of the iterations in the graph 800, DPD to each of the plurality of transmit chains based on feedback, as illustrated for example in the diagram 600, received from the at least one UE 104. Transmission of the signal $S_i$, reception of the feedback $F_i$, and application of the DPD may be a DPD training procedure, wherein the number of iterations m for the DPD training procedure is based on at least one of a power spectral density (PSD) at edges of the BW or an error vector magnitude (EVM) as a result of the transmission $S_i$ being less than a threshold. For example, referring to FIG. 6, transmission of the signal from the power amplifier, reception of the feedback from the receiver 602, and application of the DPD provide a DPD training procedure for transmitting subsequent signals. The applied DPD may be further based on feedback from one or more of the plurality of Tx chains. For example, referring to FIGS. 5-6, feedback from the receiver 602 may be based on combined signals received from the plurality of transmit chains in the transmit elements 500-550.

At 908, the base station may transmit in downlink (DL) to one or more UEs through the plurality of Tx chains and with application of the $DPD_{m+1}$, the transmission in DL including pilot signals that extend over the entire BW. For example, referring to FIGS. 1, 6, and 8, the base station 102 may transmit pilot signals to the receiver 602 through a plurality of Tx chains and with application of the DPD that extend over the entire BW, as illustrated in the graph 800. The signal $S_i$ for i=1, . . . , m and the transmission in DL may be transmitted with a power $P_i$ independent of the $BW_i$. For example, referring to FIG. 8, the signals in the graph 800 may be transmitted with a same power, regardless of the iteration and/or size of the bandwidth/bandwidth subset. The signal $S_i$ for i=1, . . . , m and the transmission in DL may be transmitted with a power back-off (BO) BOi. For example, referring to FIG. 8, the signals in the graph 800 may be transmitted with a same power BO (e.g., a power BO of 3 dB), regardless of the iteration and/or size of the bandwidth/bandwidth sub set.

At 910, where each of the plurality of Tx chains includes a power amplifier, the base station may construct a database of PA parameters associated with characteristics of each of the PAs. For example, referring to FIGS. 1 and 5-6, the base station 102 may construct a database associated with the characteristics of the power amplifiers included, for example, in the transmit elements 500-550 and in the diagram 600.

At 912, where each of the plurality of Tx chains includes a power amplifier, the base station may transmit to at least one UE an index associated with the database, wherein the received feedback is based on the transmitted index and the database including the associated characteristics of the PAs. For example, referring to FIGS. 1 and 5-6, the base station 102 may transmit to the receiver 602 an index associated with the database constructed based on the characteristics of the power amplifiers included, for example, in the transmit elements 500-550 and in the diagram 600, such that the received feedback in the diagram 600 is based on the transmitted index and the database including the associated characteristics of the PA.

Figure 10:
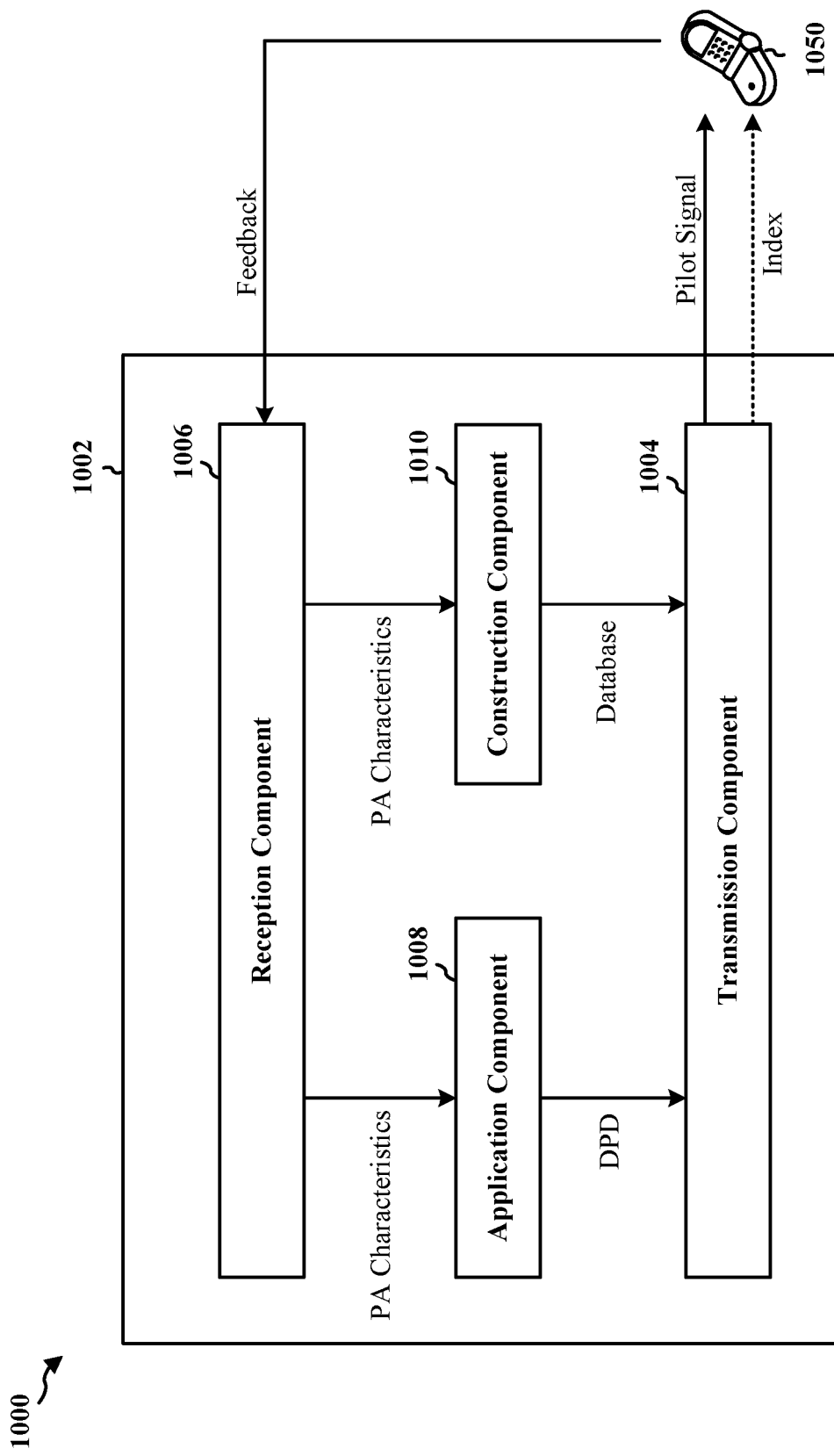
FIG. 10 is a conceptual data flow diagram illustrating the data flow between different means/components in an example apparatus.

FIG. 10 is a conceptual data flow diagram 1000 illustrating the data flow between different means/components in an example apparatus 1002. The apparatus may be a base station (e.g., base station 102, 310). The apparatus 1002 includes a transmission component 1004 that may transmit a pilot signal to at least one UE 1050. For example, as described in connection with 902, the transmission component 1004 may transmit for each iteration of a plurality of iterations, through a plurality of transmit chains and with application of a digital predistortion a signal to at least one UE over a bandwidth subset that increases in subcarrier size for each iteration.

The apparatus 1002 includes a reception component 1006 that receives feedback from the at least one UE 1050 based on the transmitted signal. For example, as described in connection with 904, the reception component 1006 may receive, for each iteration of the plurality of iterations, feedback from the at least one UE based on the transmitted signal. Characteristics of power amplifiers included in the plurality of transmit chains may be may be provided from the reception component 1006 to other components in the apparatus 1002 based on the received feedback from the at least one UE 1050.

The apparatus 1002 includes an application component 1008 that may receive the characteristics of the power amplifiers from the reception component 1006 to train the plurality of transmit chains to transmit a next pilot signal based on application of DPD. For example, as described in connection with 906, the application component 1008 may apply, for each iteration of the plurality of iterations, a digital predistortion to each of the plurality of transmit chains based on the received feedback. The apparatus 1002 further includes a construction component 1010 that may also receive the characteristics of the power amplifiers from the reception component 1006 to construct a database of PA parameters. For example, as described in connection with 910, the construction component 1010 may construct a database associated with characteristics of each of the power amplifiers included in the plurality of transmit chains.

As described in connection with 908, the transmission component 1004 may transmit in downlink to one or more UEs through the plurality of transmit chains and with application of the digital predistortion pilot signals that extend over the entire BW. Additionally or alternatively, as described in connection with 912, the transmission component 1004 may transmit to the at least one UE an index associated with the database. The transmission component 1004 may transmit the index to the at least one UE 1050 based on the database constructed by the construction component 1010.

The apparatus 1002 may include additional components that perform each of the blocks of the algorithm in the aforementioned flowchart of FIG. 9. As such, each block in the aforementioned flowchart of FIG. 9 may be performed by a component and the apparatus 1002 may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 11:
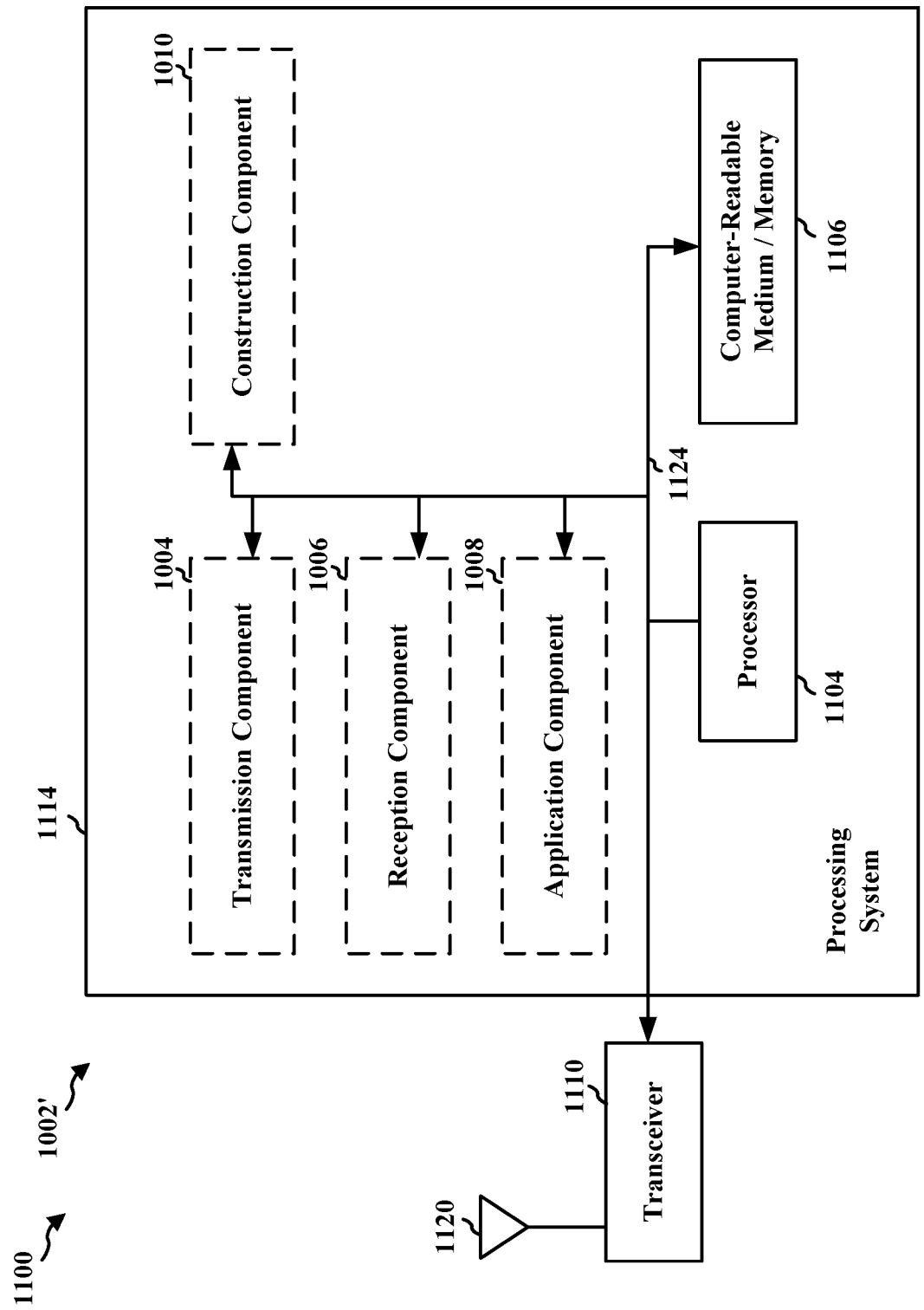
FIG. 11 is a diagram illustrating an example of a hardware implementation for an apparatus employing a processing system.

FIG. 11 is a diagram 1100 illustrating an example of a hardware implementation for an apparatus 1002' employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware components, represented by the processor 1104, the components 1004-1010, and the computer-readable medium/memory 1106. The bus 1124 may also link various other circuits such as timing sources, peripherals, voltage regulators, and power management circuits, which are well known in the art, and therefore, will not be described any further.

The processing system 1114 may be coupled to a transceiver 1110. The transceiver 1110 is coupled to one or more antennas 1120. The transceiver 1110 provides a means for communicating with various other apparatus over a transmission medium. The transceiver 1110 receives a signal from the one or more antennas 1120, extracts information from the received signal, and provides the extracted information to the processing system 1114, specifically the reception component 1006. In addition, the transceiver 1110 receives information from the processing system 1114, specifically the transmission component 1004, and based on the received information, generates a signal to be applied to the one or more antennas 1120. The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system 1114 further includes at least one of the components 1004-1010. The components may be software components running in the processor 1104, resident/stored in the computer readable medium/memory 1106, one or more hardware components coupled to the processor 1104, or some combination thereof. The processing system 1114 may be a component of the base station 310 and may include the memory 376 and/or at least one of the TX processor 316, the RX processor 370, and the controller/processor 375. Alternatively, the processing system 1114 may be the entire base station (e.g., see 310 of FIG. 3).

In one configuration, the apparatus 1002/1002' for wireless communication includes means for transmitting, receiving, applying, and constructing. The aforementioned means may be one or more of the aforementioned components of the apparatus 1002 and/or the processing system 1114 of the apparatus 1002' configured to perform the functions recited by the aforementioned means. As described supra, the processing system 1114 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Accordingly, a DPD training procedure may be performed based on an iterative process where DPD is repeatedly applied to BW subsets that increase in size with each iteration until the DPD is trained for use with the maximum allowable transmission BW. To perform the training procedure, the transmitter may apply a bypass on the DPD to transmit a pilot with a first bandwidth subset (e.g., BW/8) that acknowledges a receiver regarding a first iteration of the DPD training procedure. The receiver may determine coefficients associated with distortion caused by the PAs and feedback the coefficients to the transmitter to train the transmitter on the DPD for use with transmission of a second pilot with a second bandwidth subset (e.g., BW/4). The second pilot may similarly acknowledge the receiver regarding a second iteration, determines second coefficients based on second distortion caused by the PAs, and feedback the second coefficients to the transmitter to further train the transmitter on the DPD for use with transmission of a third pilot with a third bandwidth subset (e.g., BW/2). The same process may be repeated (e.g., for BW/2) until the transmitter is at last trained on the DPD for use with transmission of signals that extend over the full BW. In this manner, signals may be transmitted over the maximum allowable BW without having to increase the power BO.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of operation of a base station (BS), comprising:

transmitting, for each iteration i=1, . . . , m of a plurality of iterations m, through a plurality of transmit (Tx) chains and with application of a digital predistortion ($DPD_i$) a signal $S_i$ to at least one UE, where $DPD_1$ is an initial DPD and each of the signals $S_i$ for i=1, . . . , m is transmitted over a bandwidth (BW) that extends over a plurality of subcarriers, and includes pilot signals extending over a bandwidth subset $BW_i$ of the BW, where the $BW_i$ increases in subcarrier size for each iteration of i;

receiving, for each iteration i of the plurality of iterations m, feedback $F_i$ from the at least one UE based on the transmitted signal $S_i$;

applying, for each iteration i of the plurality of iterations m, a digital predistortion ($DPD_{i+i}$) to each of the plurality of Tx chains based on the received feedback $F_i$; and transmitting in downlink (DL) to one or more UEs through the plurality of Tx chains and with application of the $DPD_{m+i}$, the transmission in DL including pilot signals that extend over the entire BW.

2. The method of claim 1, wherein the signal $S_i$ for i=1, ..., m and the transmission in DL are transmitted with a power $P_i$ independent of the $BW_i$.

3. The method of claim 1, wherein the signal $S_i$ for i=1, ..., m and the transmission in DL are transmitted with a power back-off (BO) $BO_i$.

4. The method of claim 1, wherein the BW centers on a carrier frequency, and pilot signals for the signal $S_i$ are within the $BW_i$ centered on the carrier frequency and are excluded from subcarriers outside the $BW_i$ that are within the BW.

5. The method of claim 1, wherein the transmission of the signal $S_i$, the reception of the feedback $F_i$, and the application of the DPD are a DPD training procedure, wherein the number of iterations m for the DPD training procedure is based on at least one of a power spectral density (PSD) at edges of the BW or an error vector magnitude (EVM) as a result of the transmission $S_i$ being less than a threshold.

6. The method of claim 1, wherein $BW_i=BW/F_c^{m+1-i}$, and $F_c$ is a bandwidth change factor.

7. The method of claim 1, wherein the applied DPD is further based on feedback from one or more of the plurality of Tx chains.

8. The method of claim 1, wherein the at least one UE for iteration i comprises a subset $A_i$ of a set of UEs, and at least two of the UE subsets $A_1, \ldots, A_m$ are different.

9. The method of claim 8, wherein each of the UE subsets $A_1, \ldots, A_m$ are different from each other.

10. The method of claim 1, wherein each of the plurality of Tx chains includes a power amplifier (PA), the method further comprising:
constructing a database associated with characteristics of the PAs; and
transmitting to the at least one UE an index associated with the database,
wherein the received feedback is based on the transmitted index and the database including the associated characteristics of the PAs.

11. An apparatus for an operation of a base station (BS), comprising:
a memory; and
at least one processor coupled to the memory and configured to:
transmit, for each iteration i=1, ..., m of a plurality of iterations m, through a plurality of transmit (Tx) chains and with application of a digital predistortion ($DPD_i$) a signal $S_i$ to at least one UE, where $DPD_1$ is an initial DPD and each of the signals $S_i$ for i=1, ..., m is transmitted over a bandwidth (BW) that extends over a plurality of subcarriers, and includes pilot signals extending over a bandwidth subset $BW_i$ of the BW, where the $BW_i$ increases in subcarrier size for each iteration of i;
receive, for each iteration i of the plurality of iterations m, feedback $F_i$ from the at least one UE based on the transmitted signal $S_i$;

apply, for each iteration i of the plurality of iterations m, a digital predistortion ($DPD_{i+i}$) to each of the plurality of Tx chains based on the received feedback $F_i$; and
transmit in downlink (DL) to one or more UEs through the plurality of Tx chains and with application of the $DPD_{m+i}$, the transmission in DL including pilot signals that extend over the entire BW.

12. The apparatus of claim 11, wherein the signal $S_i$ for i=1, ..., m and the transmission in DL are transmitted with a power $P_i$ independent of the $BW_i$.

13. The apparatus of claim 11, wherein the signal $S_i$ for i=1, ..., m and the transmission in DL are transmitted with a power back-off (BO) $BO_i$.

14. The apparatus of claim 11, wherein the BW centers on a carrier frequency, and pilot signals for the signal $S_i$ are within the $BW_i$ centered on the carrier frequency and are excluded from subcarriers outside the $BW_i$ that are within the BW.

15. The apparatus of claim 11, wherein the transmission of the signal $S_i$, the reception of the feedback $F_i$, and the application of the DPD are a DPD training procedure, wherein the number of iterations m for the DPD training procedure is based on at least one of a power spectral density (PSD) at edges of the BW or an error vector magnitude (EVM) as a result of the transmission $S_i$ being less than a threshold.

16. The apparatus of claim 11, wherein $BW_i=BW/F_c^{m+1-i}$, and $F_c$ is a bandwidth change factor.

17. The apparatus of claim 11, wherein the applied DPD is further based on feedback from one or more of the plurality of Tx chains.

18. The apparatus of claim 11, wherein the at least one UE for iteration i comprises a subset $A_i$ of a set of UEs, and at least two of the UE subsets $A_1, \ldots, A_m$ are different.

19. The apparatus of claim 18, wherein each of the UE subsets $A_1, \ldots, A_m$ are different from each other.

20. The apparatus of claim 11, wherein each of the plurality of Tx chains includes a power amplifier (PA), the at least one processor further configured to:
construct a database associated with characteristics of the PAs; and
transmit to the at least one UE an index associated with the database,
wherein the received feedback is based on the transmitted index and the database including the associated characteristics of the PAs.

21. An apparatus for an operation of a base station (BS), comprising:
means for transmitting, for each iteration i=1, ..., m of a plurality of iterations m, through a plurality of transmit (Tx) chains and with application of a digital predistortion ($DPD_i$) a signal $S_i$ to at least one UE, where $DPD_1$ is an initial DPD and each of the signals $S_i$ for i=1, ..., m is transmitted over a bandwidth (BW) that extends over a plurality of subcarriers, and includes pilot signals extending over a bandwidth subset $BW_i$ of the BW, where the $BW_i$ increases in subcarrier size for each iteration of i;
means for receiving, for each iteration i of the plurality of iterations m, feedback $F_i$ from the at least one UE based on the transmitted signal $S_i$;
means for applying, for each iteration i of the plurality of iterations m, a digital predistortion ($DPD_{i+i}$) to each of the plurality of Tx chains based on the received feedback $F_i$; and
means for transmitting in downlink (DL) to one or more UEs through the plurality of Tx chains and with application of the DPD$_{m+1}$, the transmission in DL including pilot signals that extend over the entire BW.

22. The apparatus of claim 21, wherein the signal S$_i$ for i=1, . . . , m and the transmission in DL are transmitted with a power P$_i$ independent of the BW$_i$.

23. The apparatus of claim 21, wherein the signal S$_i$ for i=1, . . . , m and the transmission in DL are transmitted with a power back-off (BO) BO$_i$.

24. The apparatus of claim 21, wherein the BW centers on a carrier frequency, and pilot signals for the signal S$_i$ are within the BW$_i$ centered on the carrier frequency and are excluded from subcarriers outside the BW$_i$ that are within the BW.

25. The apparatus of claim 21, wherein the transmission of the signal S$_i$, the reception of the feedback F$_i$, and the application of the DPD are a DPD training procedure, wherein the number of iterations m for the DPD training procedure is based on at least one of a power spectral density (PSD) at edges of the BW or an error vector magnitude (EVM) as a result of the transmission S$_i$ being less than a threshold.

26. The apparatus of claim 21, wherein BW$_i$=BW/F$_c^{m+1-i}$, and F$_c$ is a bandwidth change factor.

27. The apparatus of claim 21, wherein the applied DPD is further based on feedback from one or more of the plurality of Tx chains.

28. The apparatus of claim 21, wherein the at least one UE for iteration i comprises a subset A$_i$ of a set of UEs, and at least two of the UE subsets A$_1$, . . . , A$_m$ are different.

29. The apparatus of claim 21, wherein each of the plurality of Tx chains includes a power amplifier (PA), the apparatus further comprising:

means for constructing a database associated with characteristics of the PAs; and means for transmitting to the at least one UE an index associated with the database, wherein the received feedback is based on the transmitted index and the database including the associated characteristics of the PAs.

30. A non-transitory computer-readable medium storing computer executable code, the code when executed by at least one processor causes the processor to:

transmit, for each iteration i=1, . . . , m of a plurality of iterations m, through a plurality of transmit (Tx) chains and with application of a digital predistortion (DPD$_i$) a signal S$_i$ to at least one UE, where DPD$_1$ is an initial DPD and each of the signals S$_i$ for i=1, . . . , m is transmitted over a bandwidth (BW) that extends over a plurality of subcarriers, and includes pilot signals extending over a bandwidth subset BW$_i$ of the BW, where the BW$_i$ increases in subcarrier size for each iteration of i;

receive, for each iteration i of the plurality of iterations m, feedback F$_i$ from the at least one UE based on the transmitted signal S$_i$;

apply, for each iteration i of the plurality of iterations m, a digital predistortion (DPD$_{i+1}$) to each of the plurality of Tx chains based on the received feedback F$_i$; and transmit in downlink (DL) to one or more UEs through the plurality of Tx chains and with application of the DPD$_{m+i}$, the transmission in DL including pilot signals that extend over the entire BW.

* * * * *